(12) United States Patent
Tu et al.

(10) Patent No.: US 9,818,779 B2
(45) Date of Patent: Nov. 14, 2017

(54) CMOS IMAGE SENSOR STRUCTURE

(71) Applicant: TAIWAN SEMICONDUCTOR MANUFACTURING CO., LTD., Hsinchu (TW)

(72) Inventors: Chien-Nan Tu, Kaohsiung (TW); Yu-Lung Yeh, Kaohsiung (TW); Hsing-Chih Lin, Tainan (TW); Chien-Chang Huang, Tainan (TW); Shih-Shiung Chen, Tainan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 14/460,051

(22) Filed: Aug. 14, 2014

(65) Prior Publication Data
US 2015/0279885 A1 Oct. 1, 2015

Related U.S. Application Data

(60) Provisional application No. 61/971,445, filed on Mar. 27, 2014.

(51) Int. Cl.
*H01L 27/146* (2006.01)

(52) U.S. Cl.
CPC .. *H01L 27/14625* (2013.01); *H01L 27/14621* (2013.01); *H01L 27/14645* (2013.01); *H01L 27/14685* (2013.01); *H01L 27/14689* (2013.01)

(58) Field of Classification Search
CPC ......... H01L 27/14685; H01L 27/14689; H01L 27/14625

USPC .......................................................... 257/436
See application file for complete search history.

(56) References Cited

U.S. PATENT DOCUMENTS

| | | | |
|---|---|---|---|
| 7,759,755 B2 * | 7/2010 | Adkisson ............... | H01L 24/05 257/222 |
| 2010/0006969 A1 * | 1/2010 | Park et al. .................... | 257/446 |
| 2011/0001038 A1 * | 1/2011 | Tseng et al. ............... | 250/208.1 |
| 2011/0019050 A1 | 1/2011 | Yamashita | |

FOREIGN PATENT DOCUMENTS

| | | |
|---|---|---|
| CN | 1518119 A | 8/2004 |
| CN | 101937921 A | 1/2011 |
| CN | 103500748 A | 1/2014 |
| EP | 1 439 582 A2 | 7/2004 |
| TW | 200414278 A | 8/2004 |

OTHER PUBLICATIONS

Pending U.S. Appl. No. 14/244,562, filed Apr. 3, 2014.

* cited by examiner

*Primary Examiner* — Laura Menz
*Assistant Examiner* — Candice Y Chan
(74) *Attorney, Agent, or Firm* — Maschoff Brennan

(57) ABSTRACT

A semiconductor device is operated for sensing incident light and includes a substrate, a device layer, a semiconductor layer and a color filter layer. The device layer is disposed on the substrate and includes light-sensing regions. The semiconductor layer overlies the device layer and has a first surface and a second surface opposite to the first surface. The first surface is adjacent to the device layer. The semiconductor layer includes microstructures on the second surface. The color filter layer is disposed on the second surface of the semiconductor layer.

20 Claims, 9 Drawing Sheets

CMOS IMAGE SENSOR STRUCTURE

RELATED APPLICATIONS

The present application is based on, and claims priority from, U.S. provisional Application Ser. No. 61/971,445, filed Mar. 27, 2014, the disclosure of which is hereby incorporated by reference herein in its entirety.

BACKGROUND

Semiconductor image sensors are operated to sense light. Typically, the semiconductor image sensors include complementary metal-oxide-semiconductor (CMOS) image sensors (CIS) and charge-coupled device (CCD) sensors, which are widely used in various applications such as digital still camera (DSC), mobile phone camera, digital video (DV) and digital video recorder (DVR) applications. These semiconductor image sensors utilize an array of image sensor elements, each image sensor element including a photodiode and other elements, to absorb light and convert the sensed light into digital data or electrical signals.

Back side illuminated (BSI) CMOS image sensors are one type of CMOS image sensors. The BSI CMOS image sensors are operable to detect light projected from their backside. The BSI CMOS image sensors can shorten optical paths and increase fill factors to improve light sensitivity per unit area and quantum efficiency, and can reduce cross talk and photo response non-uniformity. Hence, the image quality of the CMOS image sensors can be significantly improved. Furthermore, the BSI CMOS image sensors have high chief ray angles, which allow shorter lens heights to be implemented, so that thinner camera modules are achieved. Accordingly, the BSI CMOS image sensor technology is becoming a mainstream technology.

However, while existing BSI CMOS image sensors have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
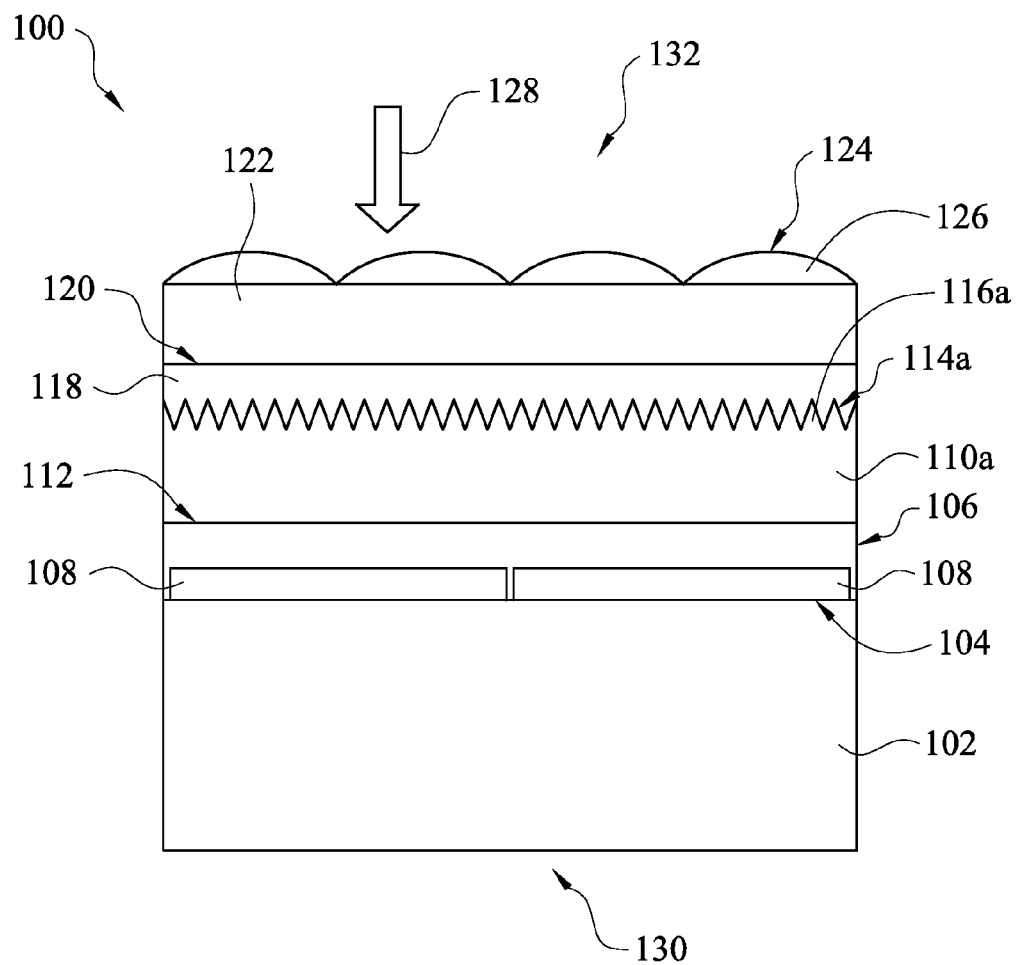
FIG. 1 is a schematic cross-sectional view of a semiconductor device in accordance with various embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. As used herein, the term "and/or" includes any and all combinations of one or more of the associated listed items.

In a typical BSI CMOS image sensor, before light, which is projected from its backside and passes through a color filter layer, enters a semiconductor layer between the color filter layer and an underlying device layer, the light collides a planar surface of the semiconductor layer, and most of the light is reflected by the planar surface of the semiconductor layer. Hence, a quantum efficiency of the BSI CMOS image sensor is decreased due to high light reflection by the semiconductor layer and low light absorption in the device layer.

Embodiments of the present disclosure are directed to providing a semiconductor device and a method for manufacturing the semiconductor device, in which a semiconductor layer between a color filter layer and a device layer has a surface on which microstructures are formed, so that most of light can be refracted by the microstructures, enter the semiconductor layer and be absorbed by the device layer. Accordingly, quantum efficiency of the semiconductor device is significantly enhanced due to low reflection and high absorption.

FIG. 1 is schematic cross-sectional view of a semiconductor device in accordance with various embodiments. In some embodiments, a semiconductor device 100 is a CMOS image sensor device, which may be operated for sensing incident light 128. The semiconductor device 100 has a front side 130 and a back side 132. In certain embodiments, the semiconductor device 100 is a BSI CMOS image sensor device, which is operated to sense the incident light 128 projected from its back side 132. As shown in FIG. 1, a semiconductor device 100 includes a substrate 102, a device layer 106, a semiconductor layer 110a and a color filter layer 122. The substrate 102 is a semiconductor substrate. The substrate 102 is composed of a single-crystalline semiconductor material or a compound semiconductor material. In some examples, the substrate 102 is a silicon substrate. In some embodiments, germanium or glass may also be used as a material of the substrate 102.

In some embodiments, the device layer 106 is disposed on a surface 104 of the substrate 102. In an alternative embodiment, a passivation layer (not shown) is additionally formed between the device layer 106 and the substrate 102. The device layer 106 includes light-sensing regions 108. In some examples, each light-sensing region 108 includes a pixel including an image sensor element, in which the image sensor element includes a photodiode and other elements. The light-sensing region 108 is operated to sense the incident light 128.

Figure 2A:
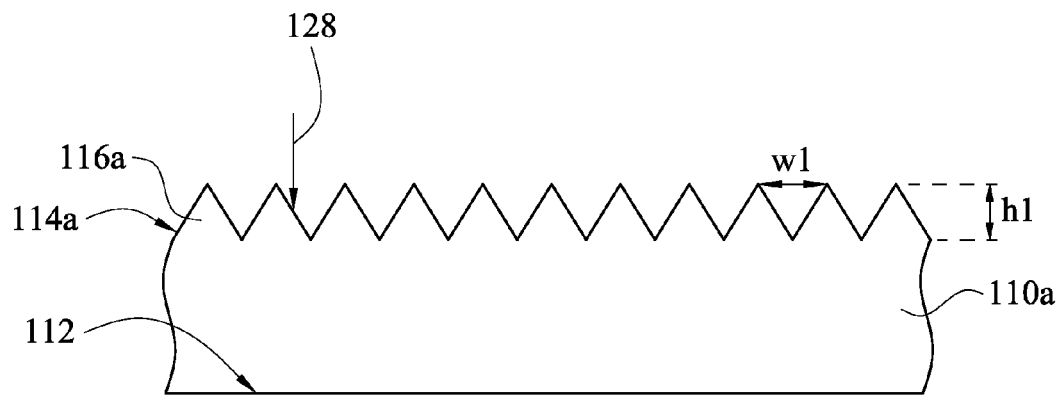
FIG. 2A is an enlarged schematic cross-sectional view of a semiconductor layer of a semiconductor device in accordance with various embodiments.
Figure 2B:
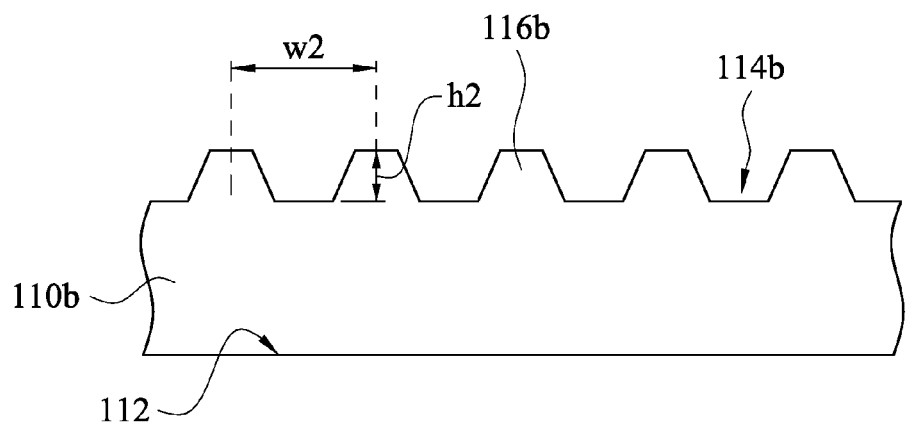
FIG. 2B is an enlarged schematic cross-sectional view of a semiconductor layer of a semiconductor device in accordance with various embodiments.

The semiconductor layer 110a overlies the device layer 106. In some embodiments, the semiconductor layer 110a is formed from silicon, germanium, epitaxial silicon and/or epitaxial germanium. The semiconductor layer 110a has a first surface 112 and a second surface 114a opposite to the first surface 112, and the first surface 112 is adjacent to the device layer 106. The semiconductor layer 110a includes microstructures 116a formed on the second surface 114a. Referring to FIG. 2A and FIG. 2B, FIG. 2A is an enlarged schematic cross-sectional view of a semiconductor layer of a semiconductor device in accordance with various embodiments and FIG. 2B is an enlarged schematic cross-sectional view of a semiconductor layer of a semiconductor device in accordance with various embodiments. In some embodiments, each microstructure 116a has a cross-section in a shape of triangle, trapezoid or arc, such as semi-circle or semi-ellipse. For example, each microstructure 116a has a cross-section in a shape of triangle as shown in FIG. 2A, and each microstructure 116b formed on a second surface 114b of a semiconductor layer 110b has a cross-section in a shape of trapezoid as shown in FIG. 2B. In the examples, the semiconductor layer 110b is similar to the semiconductor layer 110a and overlies the device layer 106, and a first surface 112 of the semiconductor layer 110b is opposite to the second surface 114b and adjacent to the device layer 106. Similarly, the semiconductor layer 110b may be formed from silicon, germanium, epitaxial silicon and/or epitaxial germanium.

In some examples, the microstructures 116a or 116b are regularly arranged. In some examples, the microstructures 116a or 116b are irregularly arranged. In addition, as shown in FIG. 2A, any two adjacent ones of the microstructures 116a may adjoin to each other. In some examples, as shown in FIG. 2B, any two adjacent ones of the microstructures 116b are separated from each other. In the semiconductor layer 110a shown in FIG. 2A, each microstructure 116a has a height h1, and a pitch w1 is formed between any two adjacent ones of the microstructures 116a. In some examples, the height h1 is between $100\lambda$ and $\lambda/100$, and the pitch w1 is between $100\lambda$ and $\lambda/100$, $\lambda$ representing a wavelength of the incident light 128. In certain examples, the height h1 is greater than $\lambda/2.5$, and the pitch w1 is greater than $\lambda/2$. In the semiconductor layer 110b shown in FIG. 2B, each microstructure 116b has a height h2, and a pitch w2 is formed between any two adjacent ones of the microstructures 116b. In some examples, the height h2 is between $100\lambda$ and $\lambda/100$, and the pitch w2 is between $100\lambda$ and $\lambda/100$. In certain examples, the height h2 is greater than $\lambda/2.5$, and the pitch w2 is greater than $\lambda/2$.

With the microstructures 116a or 116b, an area of the second surface 114a or 114b is increased, and an incident angle of the incident light 128 projected to the second surface 114a or 114b is smaller than that of the incident light 128 projected to a planar surface, so that most of the incident light 128 can be multiply refracted in the microstructures 116a, and then passes through the semiconductor layer 110a or 110b to the device layer 106, and is absorbed by the device layer 106. Hence, the absorption ratio of the incident light 128 is significantly raised.

In some embodiments, the color filter layer 122 is formed on the second surface 114a of the semiconductor layer 110a. The color filter layer 122 includes various color filters, such as red color filters, green color filters and blue color filters, which are arranged in an array. In some embodiments, as shown in FIG. 1, the semiconductor device 100 optionally includes a dielectric layer 118 formed to cover the second surface 114a of the semiconductor layer 110a. In some examples, the dielectric layer 118 is formed from silicon oxide, silicon nitride or silicon oxynitride. A surface 120 of the dielectric layer 118 is planar, and the color filter layer 122 is formed on the planar surface 120 of the dielectric layer 118.

Referring to FIG. 1 again, in some embodiments, the semiconductor device 100 optionally includes a micro-lens layer 124. The micro-lens layer 124 is formed on the color filter layer 122. The micro-lens layer 124 includes micro-lenses 126. The micro-lenses 126 may direct and focus the incident light 128 toward the light-sensing regions 108 in the device layer 106. The micro-lenses 126 may be arranged in various forms with various shapes depending on a refractive index of the micro-lenses 126 and distances between the light-sensing region 108 and the micro-lenses 126.

Figure 3A:
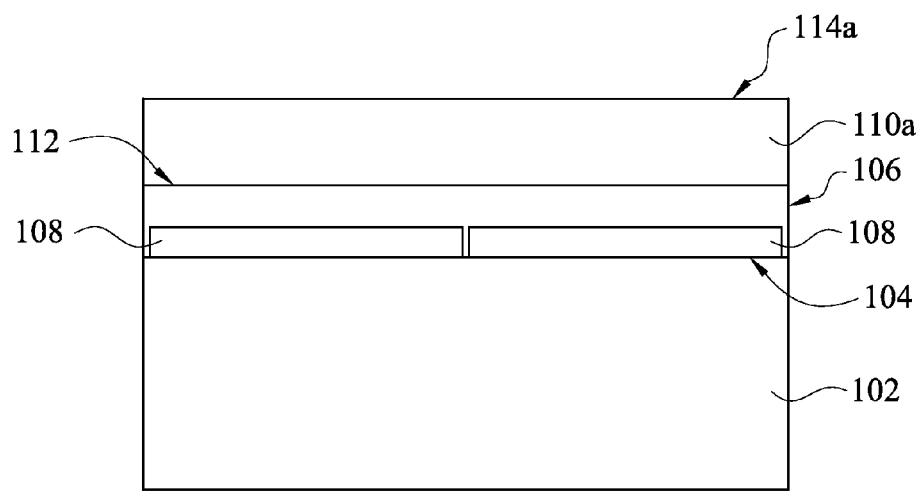
FIG. 3A through FIG. 3D are schematic cross-sectional views of intermediate stages showing a method for manufacturing a semiconductor device in accordance with various embodiments.

Referring to FIG. 3A through FIG. 3D, FIG. 3A through FIG. 3D are schematic cross-sectional views of intermediate stages showing a method for manufacturing a semiconductor device in accordance with various embodiments. As shown in FIG. 3A, a substrate 102 is provided. The substrate 102 is composed of a single-crystalline semiconductor material or a compound semiconductor material. In some embodiments, silicon, germanium or glass is used as a material forming the substrate 102. A device layer 106 and a semiconductor layer 110a are sequentially formed on a surface 104 of the substrate 102. The semiconductor layer 110a has a first surface 112 and a second surface 114a opposite to the first surface 112. In some embodiments, the device layer 106 is firstly formed on the first surface 112 of the semiconductor layer 110a, and then the device layer 106 is adhered to the surface 104 of the substrate 102 by using, for example, a bonding technique. In some examples, a thinning process is optionally performed on the second surface 114a of the semiconductor layer 110a to reduce a thickness of the semiconductor layer 110a. In certain examples, the semiconductor layer 110a is formed on a temporary substrate (not shown), and the device layer 106 is formed on the first surface 112 of the semiconductor layer 110a, and the device layer 106 is bonded to the surface 104 of the substrate 102, and then a thinning process is performed to remove the temporary substrate, in which the semiconductor layer 110a may be thinned. The thinning process may be performed using a chemical mechanical polishing (CMP) technique.

In some embodiments, the device layer 106 includes light-sensing regions 108. Each light-sensing region 108 may include a pixel including an image sensor element, and the image sensor element includes a photodiode and other elements. In some examples, the semiconductor layer 110a is formed from silicon, germanium, epitaxial silicon and/or epitaxial germanium.

Figure 3B:
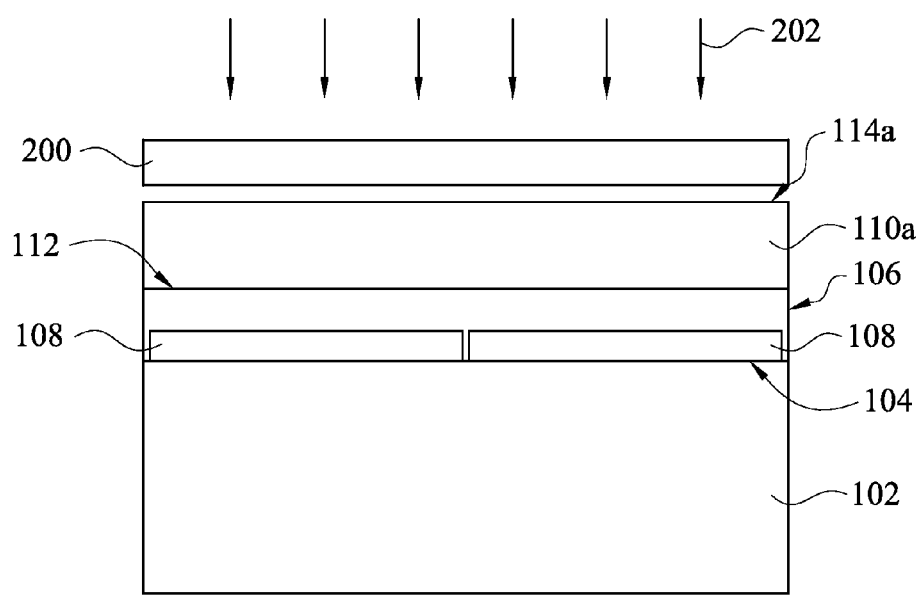
Figure 3C:
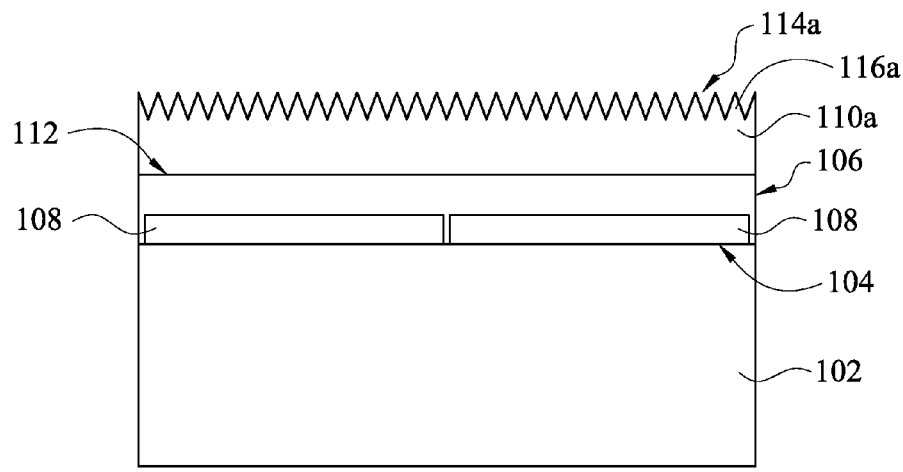

As shown in FIG. 3C, microstructures 116a are formed on the second surface 114a of the semiconductor layer 110a. In some embodiments, as shown in FIG. 3B and FIG. 3C, the operation of forming the microstructures 116a is performed using a photolithography process and an etching process, in which the photolithography process is performed to define regions where the microstructures 116a are formed by projecting light 202 through a photo mask 200 toward the second surface 114a, and the etching process is performed on the second surface 114a to remove a portion of the semiconductor layer 110a so as to form the microstructures 116a on the second surface 114a according to the definition of the photolithography process. In some examples, the etching process is performed using a dry etching technique or a chemical etching technique. In certain examples, the microstructures 116a are formed using a laser removing technique.

Each microstructure 116a may be formed with a cross-section in a shape of triangle, trapezoid or arc, such as semi-circle or semi-ellipse. The microstructures 116a are formed regularly. In some examples, the microstructures 116a are formed irregularly. In some embodiments, simultaneously referring to FIG. 2A and FIG. 3C, the operation of forming the microstructures 116a is performed to form any two adjacent ones of the microstructures 116a adjoining to each other. Referring to FIG. 2B, in the operation of forming the microstructures 116b, any two adjacent ones of the microstructures 116b may be separated from each other. Each microstructure 116a has a height h1, and a pitch w1 is formed between any two adjacent ones of the microstructures 116a. In some examples, the height h1 is between $100\lambda$ and $\lambda/100$, and the pitch w1 is between $100\lambda$ and $\lambda/100$, $\lambda$ representing a wavelength of the incident light 128. In certain examples, the height h1 is greater than $\lambda/2.5$, and the pitch w1 is greater than $\lambda/2$.

Figure 3D:
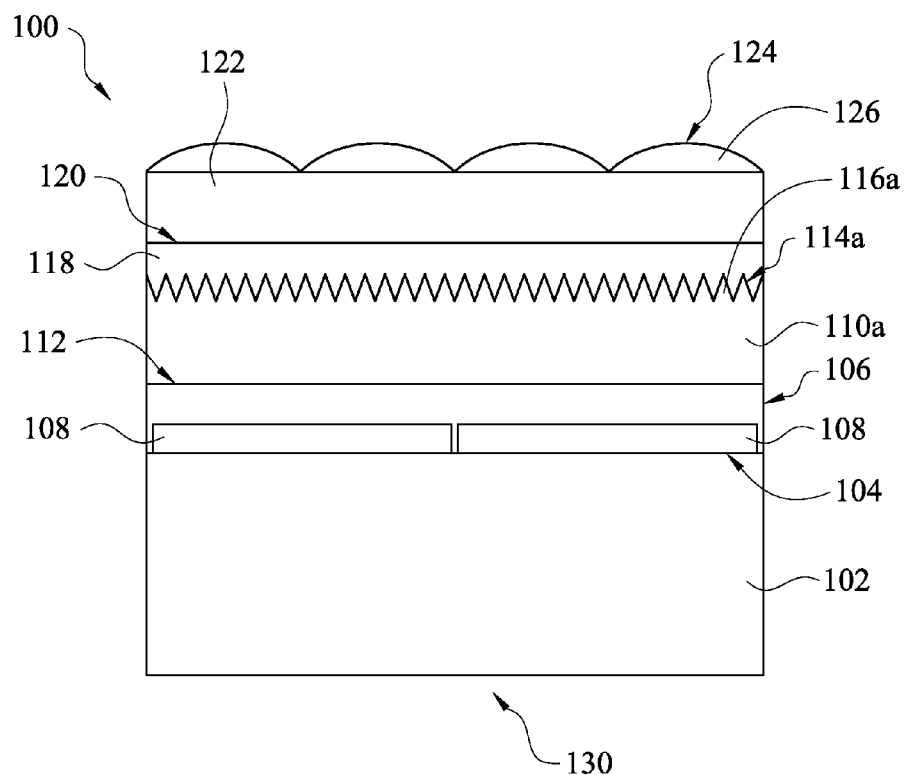

In some embodiments, after the microstructures 116a are formed, a color filter layer 122 is formed on the second surface 114a of the semiconductor layer 110a. The color filter layer 122 includes various color filters, such as red color filters, green color filters and blue color filters, which are arranged in an array. In some embodiments, as shown in FIG. 3D, after the microstructures 116a are formed, a dielectric layer 118 is formed to cover the second surface 114a of the semiconductor layer 110a and to fill the gap between any two adjacent ones of the microstructures 116a, and the color filter layer 122 is formed on the dielectric layer 118. The dielectric layer 118 may be formed from silicon oxide, silicon nitride or silicon oxynitride. The dielectric layer 118 has a planar surface 120, and the color filter layer 122 is formed on the planar surface 120. In some examples, the operation of forming the dielectric layer 118 is performed using a thermal oxide technique or a deposition technique, such as a chemical vapor deposition (CVD) technique. In certain examples, after the dielectric layer 118 is formed, a planarization process is performed on the dielectric layer 118 to form the dielectric layer 118 having the planar surface 120. The planarization process may be performed using a chemical mechanical polishing technique.

In some embodiments, after the color filter layer 122 is formed, a micro-lens layer 124 including micro-lenses 126 is optionally formed on the color filter layer 122 to complete the semiconductor device 100. The operation of forming the micro-lenses 126 may be performed to form the micro-lenses 126 in various arrangements and various shapes depending on a refractive index of the micro-lenses 126 and distances between the light-sensing region 108 and the micro-lenses 126.

Figure 4:
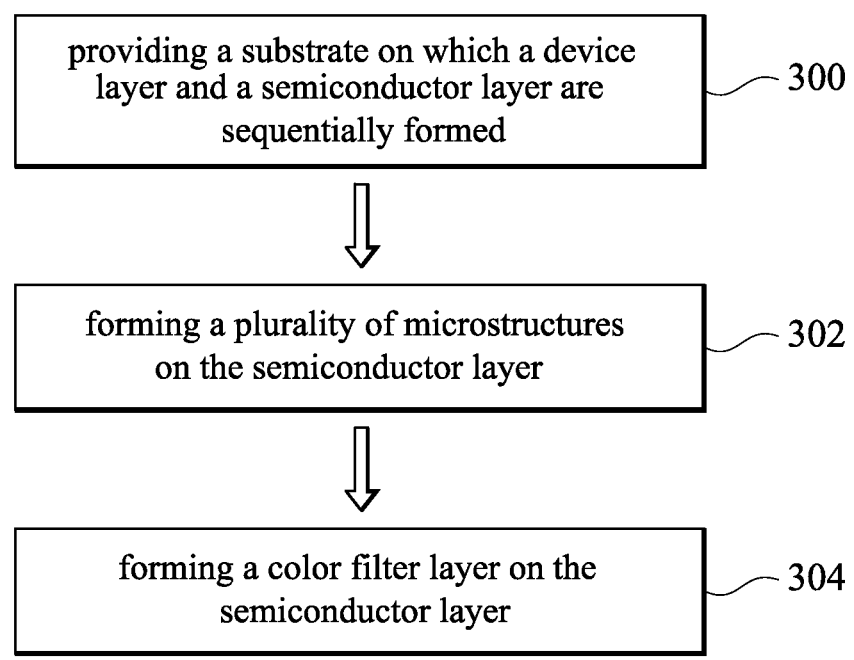
FIG. 4 is a flow chart of a method for manufacturing a semiconductor device in accordance with various embodiments.

Referring to FIG. 4 with FIG. 3A through FIG. 3D, FIG. 4 is a flow chart of a method for manufacturing a semiconductor device in accordance with various embodiments. The method begins at operation 300, where a substrate 102 is provided, and a device layer 106 and a semiconductor layer 110a are sequentially formed on a surface 104 of the substrate 102, as shown in FIG. 3A. The semiconductor layer 110a has a first surface 112 and a second surface 114a opposite to the first surface 112. In some embodiments, the device layer 106 is formed on the first surface 112 of the semiconductor layer 110a, and the device layer 106 is adhered to the surface 104 of the substrate 102 by using, for example, a bonding method. Optionally, a thinning process is performed on the second surface 114a of the semiconductor layer 110a to reduce a thickness of the semiconductor layer 110a.

At operation 302, as shown in FIG. 3B and FIG. 3C, microstructures 116a are formed on the second surface 114a of the semiconductor layer 110a by using, for example, a photolithography process and an etching process. In some examples, the etching process is performed using a dry etching technique or a chemical etching technique. In certain examples, the microstructures 116a are formed using a laser removing technique. The operation of forming the microstructures 116a may be performed to form each microstructure 116a with a cross-section in a shape of triangle, trapezoid or arc, such as semi-circle or semi-ellipse. The microstructures 116a may be formed regularly. In some examples, the microstructures 116a are formed irregularly.

In some embodiments, the operation of forming the microstructures 116a is performed to form any two adjacent ones of the microstructures 116a adjoining to each other, as shown in FIG. 2A. Alternately, as shown in FIG. 2B, any two adjacent ones of the microstructures 116b may be formed to be separated from each other. In some examples, the height of each microstructure 116a is between $100\lambda$ and $\lambda/100$, and the pitch between any two adjacent ones of the microstructures 116a is between $100\lambda$ and $\lambda/100$, $\lambda$ representing a wavelength of the incident light. In certain examples, the height of each microstructure 116a is greater than $\lambda/2.5$, and the pitch between any two adjacent ones of the microstructures 116a is greater than $\lambda/2$.

At operation 304, a color filter layer 122 is formed on the second surface 114a of the semiconductor layer 110a. The color filter layer 122 includes various color filters, such as red color filters, green color filters and blue color filters, which are arranged in an array. In some embodiments, as shown in FIG. 3D, a dielectric layer 118 is firstly formed to cover the second surface 114a of the semiconductor layer 110a and to fill the gap between any two adjacent ones of the microstructures 116a using a thermal technique or a deposition technique, and the color filter layer 122 is formed on the dielectric layer 118. The dielectric layer 118 has a planar surface 120 formed by a planarization process, and the color filter layer 122 is formed on the planar surface 120. In some embodiments, a micro-lens layer 124 including micro-lenses 126 is optionally formed on the color filter layer 122 to complete the semiconductor device 100.

Figure 5A:
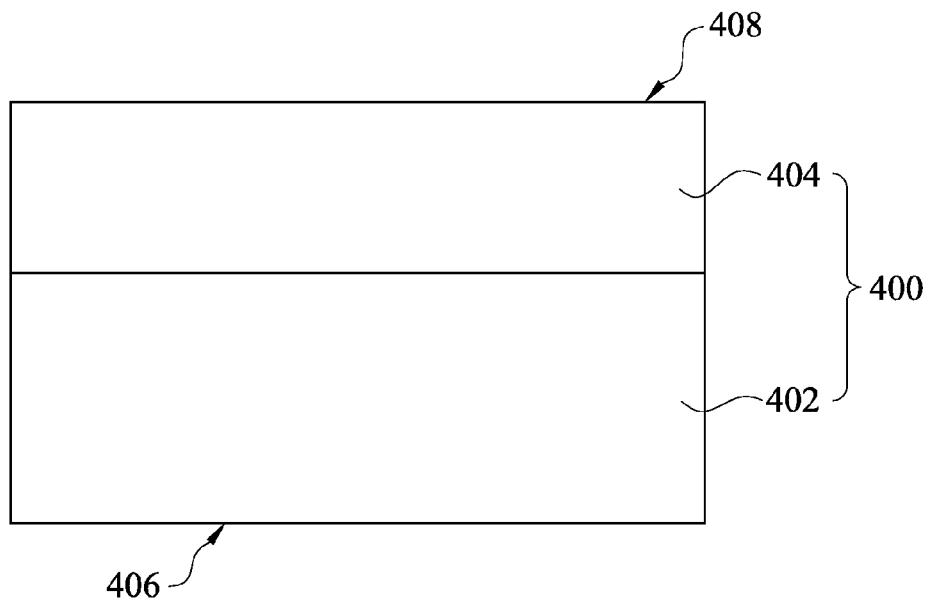
FIG. 5A through FIG. 5F are schematic cross-sectional views of intermediate stages showing a method for manufacturing a semiconductor device in accordance with various embodiments.

FIG. 5A through FIG. 5F are schematic cross-sectional views of intermediate stages showing a method for manufacturing a semiconductor device in accordance with various embodiments. As shown in FIG. 5A, a first substrate 400 is provided. The first substrate 400 has a first surface 406 and a second surface 408 which are two opposite sides of the first substrate 400. The first substrate 400 may be composed of a single-layered structure. In some embodiments, as shown in FIG. 5A, the first substrate 400 includes a first layer 402 and a second layer 404 stacked on the first layer 402. The first layer 402 and the second layer 404 are composed of single-crystalline semiconductor materials or compound semiconductor materials. In some examples, silicon, germanium, epitaxial silicon, epitaxial germanium or glass is used as materials forming the first layer 402 and the second layer 404. The first layer 402 and the second layer 404 may be formed from different materials, for example, the first layer 402 is formed from silicon and the second layer 404 is formed from epitaxial silicon. In certain examples, the first layer 402 and the second layer 404 may be formed from the same material.

Figure 5B:
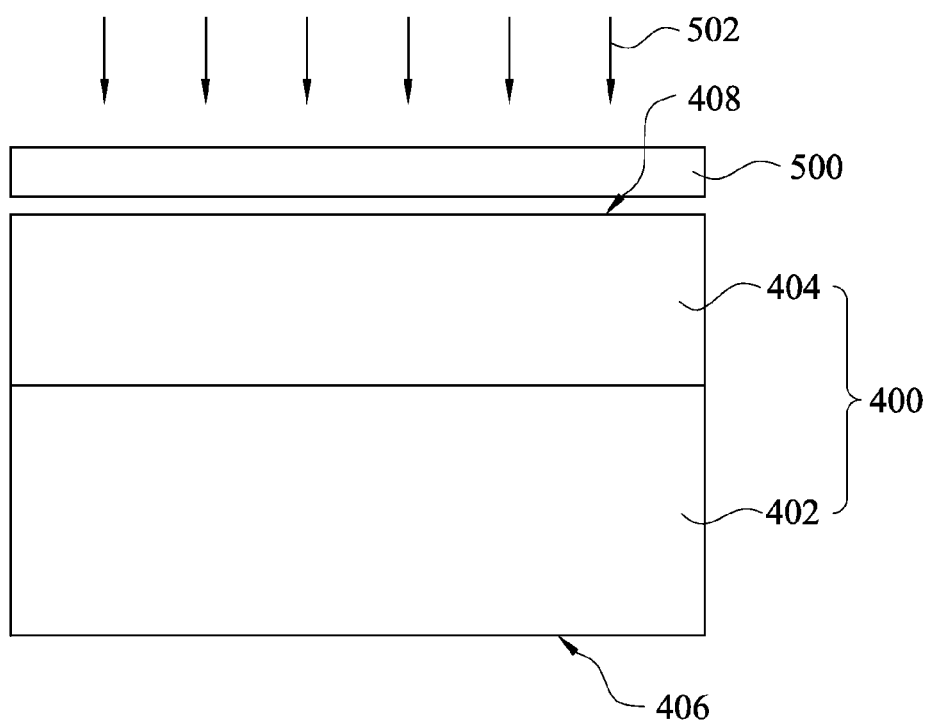
Figure 5C:
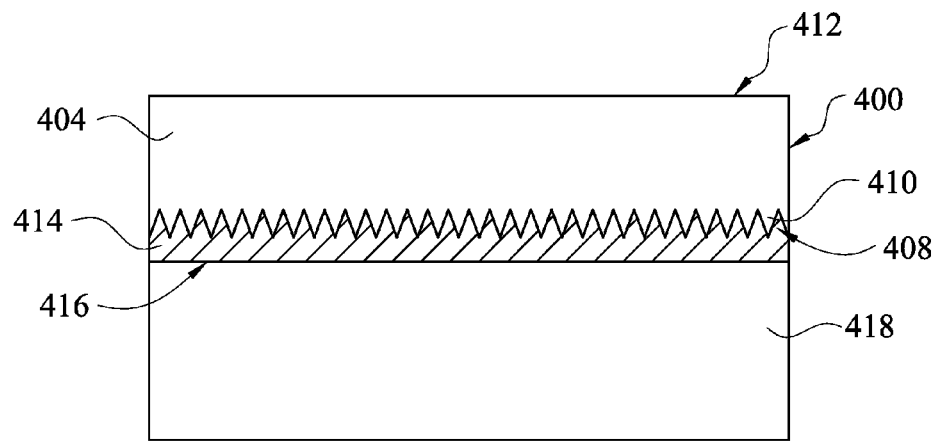

As shown in FIG. 5C, microstructures 410 are formed on the second surface 408 of the first substrate 400, in which the microstructures 410 are formed on the second layer 404. In some embodiments, as shown in FIG. 5B and FIG. 5C, the operation of forming the microstructures 410 is performed using a photolithography process and an etching process, in which the photolithography process is performed by projecting light 502 through a photo mask 500 toward the second surface 408, and the etching process is performed on the second surface 408 to remove a portion of the second layer 404 of the first substrate 400 to form the microstructures 410 on the second surface 408 according to the definition of the photolithography process. In some examples, the etching process is performed using a dry etching technique or a chemical etching technique. In certain examples, the microstructures 410 are formed using a laser removing technique.

In some examples, each microstructure 410 may be formed with a cross-section in a shape of triangle, trapezoid or arc, such as semi-circle or semi-ellipse. The microstructures 410 may be arranged regularly. In some examples, the microstructures 410 are arranged irregularly. In some embodiments, referring to FIG. 5C again, the operation of forming the microstructures 410 is performed to form any two adjacent ones of the microstructures 410 adjoining to each other. Simultaneously referring to FIG. 2B and FIG. 5C, the arrangement of the microstructures 410 may be similar to the microstructures 116b, in which any two adjacent ones of the microstructures 410 may be formed to be separated from each other. Similar to the microstructures 116a in FIG. 2A or the microstructures 116b in FIG. 2B, a height of each microstructure 410 may be between $100\lambda$ and $\lambda/100$, and a pitch between any two adjacent ones of the microstructures 410 may be between $100\lambda$ and $\lambda/100$, $\lambda$ representing a wavelength of the incident light. In certain examples, the height of each microstructure 410 is greater than $\lambda/2.5$, and the pitch w1 between any two adjacent ones of the microstructures 410 is greater than $\lambda/2$. The arrangements and the shapes of the microstructures 410 may be similar to those of the microstructures 116a in FIG. 2A or those of the microstructures 116b in FIG. 2B.

After the microstructures 410 are formed on the second surface 408 of the first substrate 400, a dielectric layer 414 is formed to cover the second surface 408 of the first substrate 400 and fills the gap between any two adjacent ones of the microstructures 410, as shown in FIG. 5C. In some examples, the operation of forming the dielectric layer 414 is performed using a thermal oxidation technique or a chemical vapor deposition technique. For example, the dielectric layer 414 is formed from oxide, such as silicon oxide. Optionally, a planarization operation is performed on the dielectric layer 414, so that a surface 416 of the dielectric layer 414 is planar. The planarization operation may be performed using a chemical mechanical polishing technique.

After the operation of forming the dielectric layer 414, a second substrate 418 is provided, and the second substrate 418 is bonded to the surface 416 of the dielectric layer 414. The surface 416 of the dielectric layer 414 is planarized to be planar, so that the second substrate 418 can be successfully and firmly bonded to the surface 416 of the dielectric layer 414. In some examples, the second substrate 418 is formed from glass or a semiconductor material such as silicon and germanium. Optionally, after the bonding operation, a thinning operation is performed on the first surface 406 of the first substrate 400 to remove a portion of the first substrate 400 by using, for example, a chemical mechanical polishing technique or an etching technique. In certain examples, as shown in FIG. 5C, the first layer 402 of the first substrate 400 is removed to expose a surface 412 of the second layer 404.

Figure 5D:
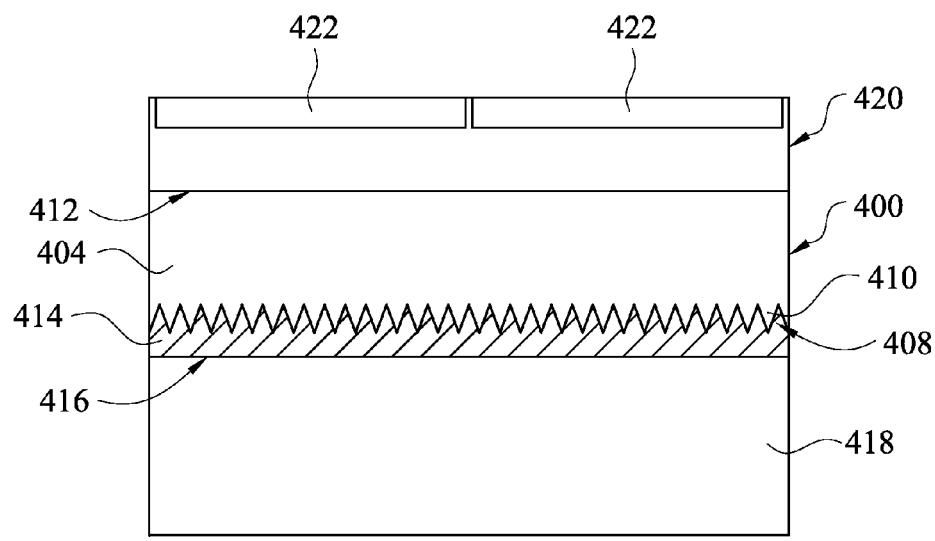

Then, as shown in FIG. 5D, a device layer 420 is formed on the surface 412 of the second layer 404 of the first substrate 400. The device layer 420 includes light-sensing regions 422. In some examples, each light-sensing region 422 includes a pixel, and the pixel includes an image sensor element which includes a photodiode and other elements.

Figure 5E:
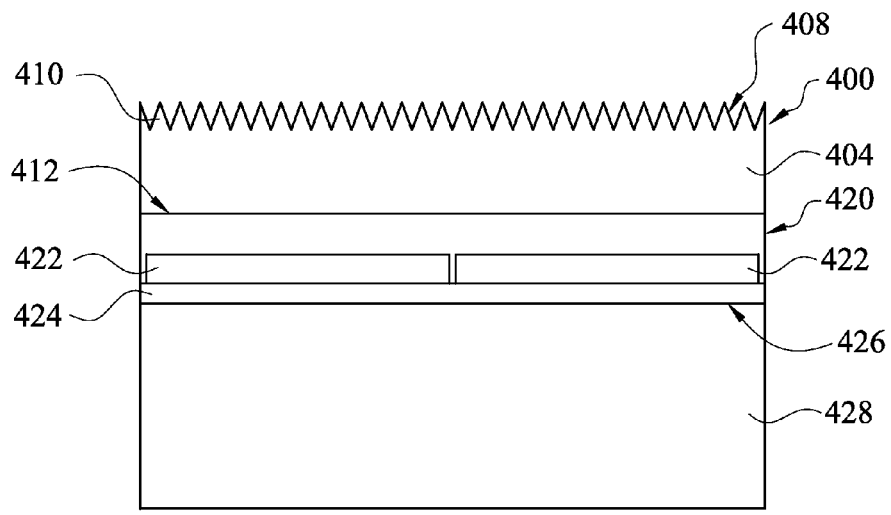

In some embodiments, after the device layer 420 is formed, a third substrate 428 is provided, and then the third substrate 428 is bonded to the device layer 420. For example, the third substrate 428 is formed from glass or a semiconductor material, such as silicon and germanium. In some embodiments, as shown in FIG. 5E, before the bonding operation of the third substrate 428, a passivation layer 424 is formed to cover the device layer 420. For example, the passivation layer 424 may be formed from silicon oxide, silicon nitride or silicon oxynitride. In some examples, a planarization operation is performed on the passivation layer 424, so that a surface 426 of the passivation layer 424 can be planar. The planarization operation may be performed using a chemical mechanical polishing technique. Because the surface 426 of the passivation layer 424 is planarized to be planar, the third substrate 428 can be successfully and firmly bonded to the surface 426 of the passivation layer 424.

After the bonding operation of the third substrate 428, a thinning operation is performed on the second substrate 418 to subsequently remove the second substrate 418 and the dielectric layer 414 by using, for example, a chemical mechanical polishing technique and/or an etching technique. After the thinning operation, the microstructures 410 on the second surface 408 of the first substrate 400 are exposed, as shown in FIG. 5E.

Figure 5F:
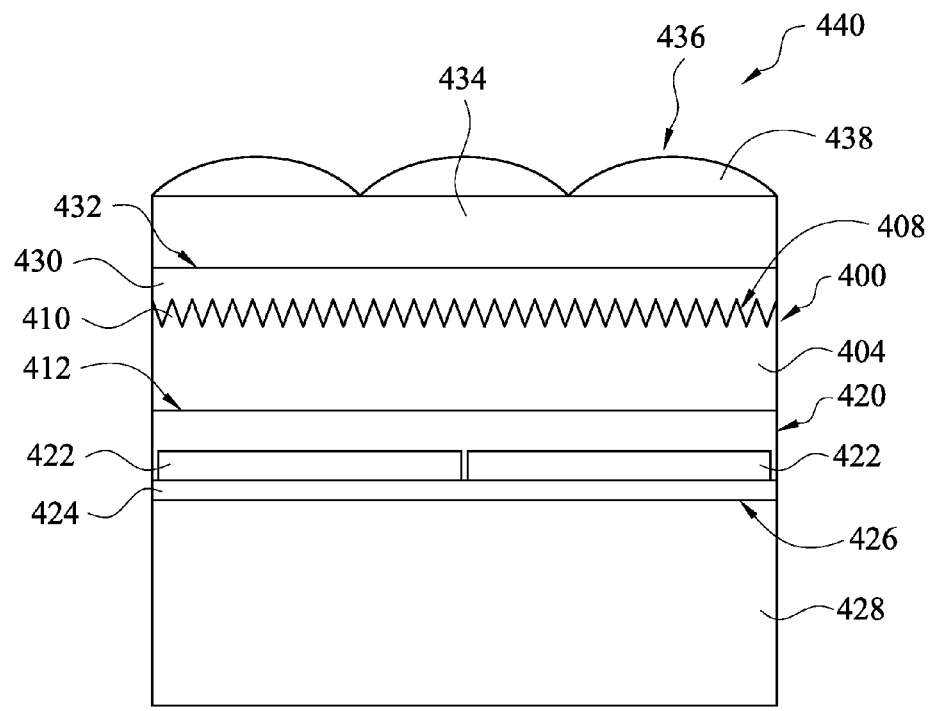

In some embodiments, after the microstructures 410 are exposed, a color filter layer 434 is formed on the second surface 408 of the first substrate 400. The color filter layer 434 includes various color filters, such as red color filters, green color filters and blue color filters, which are arranged in an array. In some embodiments, as shown in FIG. 5F, after the microstructures 410 are exposed, a dielectric layer 430 is formed to cover the second surface 408 of the first substrate 400 and to fill the gap between any two adjacent ones of the microstructures 410, and the color filter layer 434 is then formed on the dielectric layer 430. The dielectric layer 430 may be formed from silicon oxide, silicon nitride or silicon oxynitride. The dielectric layer 430 has a planar surface 432, and the color filter layer 434 is formed on the planar surface 432. The dielectric layer 430 may be formed by using a thermal oxidation technique or a deposition technique, such as a chemical vapor deposition technique. Optionally, after the dielectric layer 430 is formed, a planarization process is performed on the dielectric layer 430, so that the surface 432 of the dielectric layer 430 is planar. The planarization process may be performed using a chemical mechanical polishing technique.

In some embodiments, as shown in FIG. 5F again, after the color filter layer 434 is formed, a micro-lens layer 436 including micro-lenses 438 is formed on the color filter layer 434 to complete the semiconductor device 440. The operation of forming the micro-lenses 438 may be performed to form the micro-lenses 438 in various arrangements and various shapes depending on a refractive index of the micro-lenses 438 and distances between the light-sensing region 422 and the micro-lenses 438.

Figure 6:
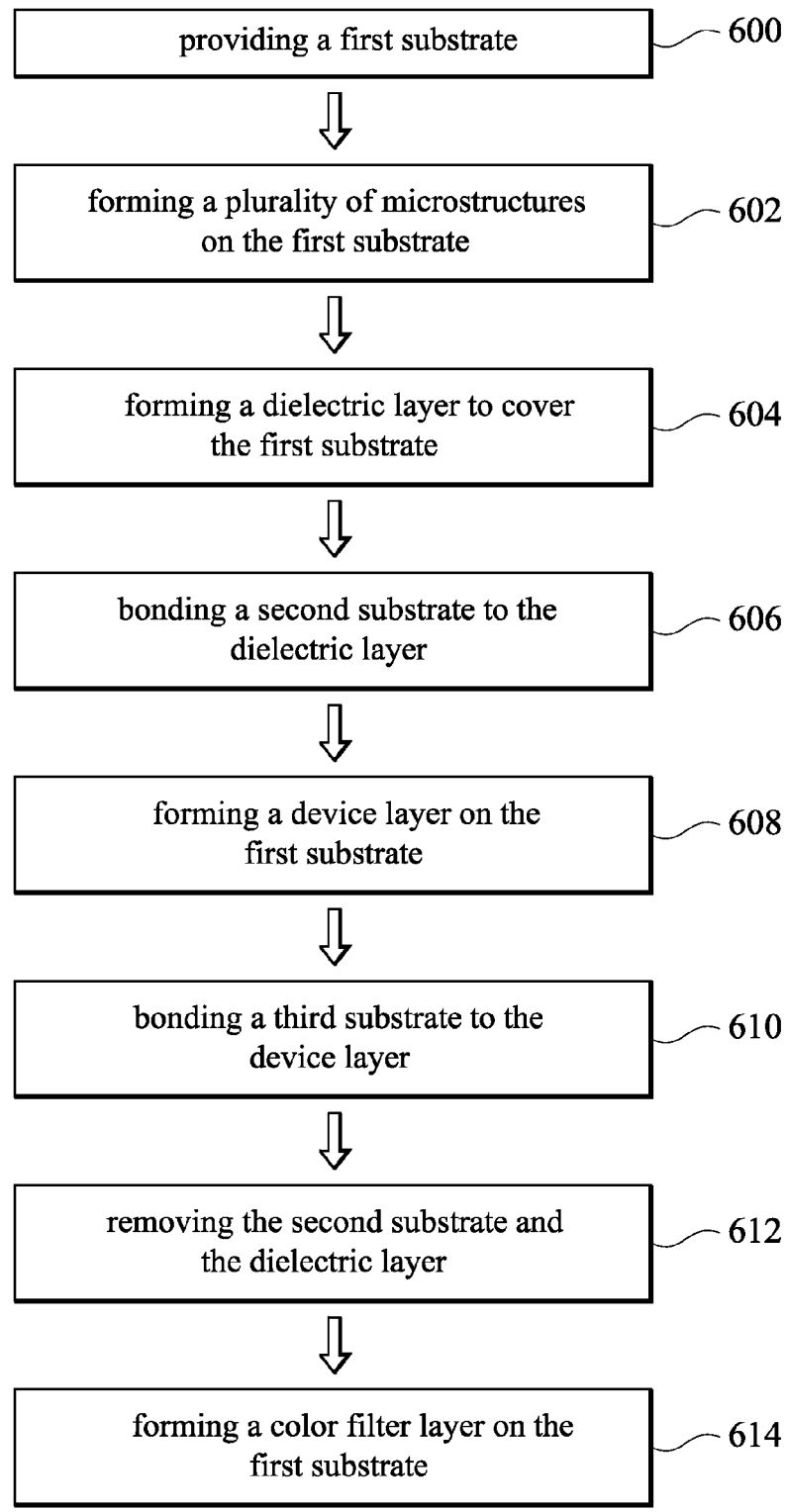
FIG. 6 is a flow chart of a method for manufacturing a semiconductor device in accordance with various embodiments.

Referring to FIG. 6 with FIG. 5A through FIG. 5F, FIG. 6 is a flow chart of a method for manufacturing a semiconductor device in accordance with various embodiments. The method begins at operation 600, where a first substrate 400 having a first surface 406 and a second surface 408 opposite to the first surface 406 is provided. The first substrate 400 may be composed of a single-layered structure. In some embodiments, as shown in FIG. 5A, the first substrate 400 includes a first layer 402 and a second layer 404 stacked on the first layer 402. The first layer 402 and the second layer 404 may be formed from different materials. In certain examples, the first layer 402 and the second layer 404 may be formed from the same material.

At operation 602, as shown in FIG. 5B and FIG. 5C, microstructures 410 are formed on the second surface 408 of the first substrate 400 by using, for example, a photolithography process and an etching process. In some examples, the etching process is performed using a dry etching technique or a chemical etching technique. The microstructures 410 may be formed using a laser removing technique. The operation of forming the microstructures 410 may be performed to form each microstructure 116a with a cross-section in a shape of triangle, trapezoid or arc, such as semi-circle or semi-ellipse. The microstructures 116a 410 may be formed regularly. In some examples, the microstructures 410 are formed irregularly.

In some embodiments, the operation of forming the microstructures 410 is performed to form any two adjacent ones of the microstructures 410 adjoining to each other, such as the microstructures 116a shown in FIG. 2A. Such as the microstructures 116b shown in FIG. 2B, any two adjacent ones of the microstructures 410 may be formed to be separated from each other. In some examples, the height of each microstructure 410 is between 100λ and λ/100, and the pitch between any two adjacent ones of the microstructures 410 is between 100λ and λ/100, λ representing a wavelength of the incident light. In certain examples, the height of each microstructure 410 is greater than λ/2.5, and the pitch between any two adjacent ones of the microstructures 410 is greater than λ/2.

At operation 604, as shown in FIG. 5C, a dielectric layer 414 is formed to cover the second surface 408 of the first substrate 400. In some examples, the operation of forming the dielectric layer 414 is performed using a thermal oxidation technique or a chemical vapor deposition technique. Optionally, a planarization operation may be performed on the dielectric layer 414 by using, for example, a chemical mechanical polishing technique to form the dielectric layer 414 with a planar surface 416.

At operation 606, as shown in FIG. 5C again, a second substrate 418 is provided and bonded to the surface 416 of the dielectric layer 414. In some examples, the second substrate 418 is formed from glass or a semiconductor material. Optionally, a thinning operation is performed on the first surface 406 of the first substrate 400 to remove a portion of the first substrate 400 by using, for example, a chemical mechanical polishing technique or an etching technique. In certain examples, the first layer 402 of the first substrate 400 is removed to expose a surface 412 of the second layer 404. At operation 608, as shown in FIG. 5D, a device layer 420 is formed on the surface 412 of the second layer 404 of the first substrate 400. The device layer 420 includes light-sensing regions 422. Each light-sensing region 422 may include a pixel.

At operation 610, a third substrate 428 is provided and bonded to the device layer 420. The third substrate 428 may be formed from glass or a semiconductor material such as silicon and germanium. In some embodiments, as shown in FIG. 5E, a passivation layer 424 is formed to cover the device layer 420. In some examples, the passivation layer 424 is planarized using, for example, a chemical mechanical polishing technique, so that a surface 426 of the passivation layer 424 is planar. At operation 612, a thinning operation is performed on the second substrate 418 to subsequently remove the second substrate 418 and the dielectric layer 414 to expose the second surface 408 of the first substrate 400 and the microstructures 410 by using, for example, a chemical mechanical polishing technique and/or an etching technique.

At operation 614, a color filter layer 434 is formed on the second surface 408 of the first substrate 400. The color filter layer 434 includes various color filters, such as red color filters, green color filters and blue color filters, which are arranged in an array. In some embodiments, as shown in FIG. 5F, a dielectric layer 430 is formed to cover the second surface 408 of the first substrate 400, and the color filter layer 434 is then formed on the dielectric layer 430. In certain examples, the dielectric layer 430 has a planar surface 432, and the color filter layer 434 is formed on the planar surface 432. Optionally, a planarization process is performed on the dielectric layer 430 using, for example, a chemical mechanical polishing technique. In some embodiments, a micro-lens layer 436 including micro-lenses 438 is formed on the color filter layer 434 to complete the semiconductor device 440.

In accordance with an embodiment, the present disclosure discloses a semiconductor device, which is operated for sensing an incident light. The semiconductor device includes a substrate, a device layer, a semiconductor layer and a color filter layer. The device layer is disposed on the substrate and includes light-sensing regions. The semiconductor layer is overlying the device layer and has a first surface and a second surface opposite to the first surface. The first surface is adjacent to the device layer. The semiconductor layer includes microstructures on the second surface. The color filter layer is disposed on the second surface of the semiconductor layer.

In accordance with another embodiment, the present disclosure discloses a method for manufacturing a semiconductor device. In this method, a substrate is provided, and a device layer and a semiconductor layer are sequentially formed on a surface of the substrate. The semiconductor layer has a first surface and a second surface opposite to the first surface which is adjacent to the device layer. Microstructures are formed on the second surface of the semiconductor layer. A color filter layer is formed on the second surface of the semiconductor layer.

In accordance with yet another embodiment, the present disclosure discloses a method for manufacturing a semiconductor device. In this method, a first substrate having a first surface and a second surface opposite to the first surface is provided. Microstructures are formed on the second surface of the first substrate. A dielectric layer is formed to cover the second surface of the first substrate. A second substrate is bonded to the dielectric layer. A device layer is formed on the first surface of the first substrate. A third substrate is bonded to the device layer. The second substrate and the dielectric layer are removed to expose the second surface of the first substrate. A color filter layer is formed on the second surface of the first substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor device, the method comprising:
providing a semiconductor layer, wherein the semiconductor layer has a first surface and a second surface opposite to the first surface;
forming a device layer including a plurality of light-sensing regions on the first surface of the semiconductor layer;
bonding the device layer to a surface of a substrate after forming the device layer on the first surface of the semiconductor layer;
performing a thinning process on the second surface of the semiconductor layer after bonding the device layer on the surface of the substrate;
forming a plurality of microstructures on the second surface of the semiconductor layer by removing a portion of the semiconductor layer after bonding the device layer on the surface of the substrate;
forming a dielectric layer to fill a gap between any two adjacent microstructures, wherein the dielectric layer has a planar surface opposite to the microstructures; and
forming a color filter layer on the planar surface of the dielectric layer.

2. The method of claim 1, wherein providing the semiconductor layer comprises forming the semiconductor layer from silicon or germanium.

3. The method of claim 1, wherein forming the microstructures is performed using a photolithography process and an etching process.

4. The method of claim 1, wherein forming the microstructures is performed to form each of the microstructures with a cross-section in a shape of triangle, trapezoid, or arc.

5. The method of claim 1, wherein forming the microstructures is performed to form any two adjacent ones of the microstructures adjoining to each other.

6. The method of claim 1, wherein forming the microstructures is performed to form any two adjacent ones of the microstructures separated from each other.

7. The method of claim 1, further comprising forming a plurality of micro-lenses on the color filter layer.

8. The method of claim 1, wherein forming the microstructures is performed to form each of the microstructures having a height of greater than $\lambda/2.5$, $\lambda$ representing a wavelength of an incident light.

9. The method of claim 1, wherein forming the microstructures is performed to form any two adjacent ones of the microstructures between which a pitch is greater than $\lambda/2$, $\lambda$ representing a wavelength of an incident light.

10. A method for manufacturing a semiconductor device, the method comprising:
providing a semiconductor layer, wherein the semiconductor layer has a first surface and a second surface opposite to the first surface;
forming a device layer including a plurality of light-sensing regions on the first surface of the semiconductor layer;
bonding the device layer to a surface of a substrate after forming the device layer on the first surface of the semiconductor layer;
performing a thinning process on the second surface of the semiconductor layer after bonding the device layer on the surface of the substrate;
forming a photomask above the second surface of the semiconductor layer after bonding the device layer on the surface of the substrate;
projecting light through the photomask toward the second surface of the semiconductor layer;
performing an etching process on the second surface of the semiconductor layer to remove a portion of the semiconductor layer after projecting the light, thereby forming a plurality of microstructures on the second surface;
forming a dielectric layer to fill a gap between any two adjacent microstructures; and
forming a color filter layer on the dielectric layer.

11. The method of claim 10, wherein the etching process forms each of the microstructures with a cross-section in a shape of triangle, trapezoid, or arc.

12. The method of claim 10, wherein the etching process forms any two adjacent ones of the microstructures adjoining to each other.

13. The method of claim 10, wherein the etching process forms any two adjacent ones of the microstructures separated from each other.

14. The method of claim 10, further comprising forming a plurality of micro-lenses on the color filter layer.

15. The method of claim 10, wherein the etching process is performed to form each of the microstructures having a height of greater than $\lambda/2.5$, $\lambda$ representing a wavelength of an incident light.

16. The method of claim 10, wherein the etching process is performed to form any two adjacent ones of the microstructures between which a pitch is greater than $\lambda/2$, $\lambda$ representing a wavelength of an incident light.

17. A method for manufacturing a semiconductor device, the method comprising:
providing a semiconductor layer, wherein the semiconductor layer has a first surface and a second surface opposite to the first surface;
forming a device layer including a plurality of light-sensing regions on the first surface of the semiconductor layer;
bonding the device layer to a surface of a substrate after forming the device layer on the first surface of the semiconductor layer;
performing a thinning process on the second surface of the semiconductor layer after bonding the device layer on the surface of the substrate;
forming a plurality of microstructures on the second surface of the semiconductor layer by using a laser removing technique to remove a portion of the semiconductor layer after bonding the device layer on the surface of the substrate;
forming a dielectric layer to fill a gap between any two adjacent microstructures;
performing a planarization process on the dielectric layer to form a planar surface of the dielectric layer; and
forming a color filter layer on the planar surface of the dielectric layer.

18. The method of claim 17, wherein the thinning process is performed using a chemical mechanical polishing (CMP) technique.

19. The method of claim 17, wherein the planarization process is performed using a CMP technique.

20. The method of claim 17, further comprising forming a plurality of micro-lenses on the color filter layer.

* * * * *